United States Patent
Lian et al.

(10) Patent No.: US 10,788,758 B2
(45) Date of Patent: Sep. 29, 2020

(54) METHOD OF MEASURING A PARAMETER OF INTEREST, DEVICE MANUFACTURING METHOD, METROLOGY APPARATUS, AND LITHOGRAPHIC SYSTEM

(71) Applicant: ASML Netherlands B.V., Veldhoven (NL)

(72) Inventors: Jin Lian, Eindhoven (NL); Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/954,995

(22) Filed: Apr. 17, 2018

(65) Prior Publication Data

US 2018/0321598 A1   Nov. 8, 2018

(30) Foreign Application Priority Data

May 5, 2017   (EP) .................................. 17169624

(51) Int. Cl.
*G03F 7/20* (2006.01)

(52) U.S. Cl.
CPC ...... *G03F 7/70633* (2013.01); *G03F 7/70066* (2013.01); *G03F 7/70133* (2013.01); *G03F 7/70158* (2013.01); *G03F 7/70625* (2013.01); *G03F 7/70341* (2013.01)

(58) Field of Classification Search
CPC ............. G03F 7/70066; G03F 7/70133; G03F 7/70158; G03F 7/70341; G03F 7/70625; G03F 7/70633; H01L 22/10
See application file for complete search history.

(56) References Cited

U.S. PATENT DOCUMENTS

| | | | | |
|---|---|---|---|---|
| 10,289,008 | B2 * | 5/2019 | Jak | G03F 7/70508 |
| 10,317,805 | B2 * | 6/2019 | Schmetz-Schagen | G01B 11/028 |
| 10,331,043 | B2 * | 6/2019 | Van Buel | G01N 21/93 |
| 2006/0033921 | A1 | 2/2006 | Den Boef et al. | |
| 2008/0144036 | A1 | 6/2008 | Schaar et al. | |

(Continued)

FOREIGN PATENT DOCUMENTS

WO   WO 2009/078708 A1   6/2009
WO   WO 2009/106279 A1   9/2009

OTHER PUBLICATIONS

International Search Report from related International Patent Application No. PCT/EP2018/059304, dated Aug. 7, 2018; 3 pages.

(Continued)

*Primary Examiner* — Deoram Persaud
(74) *Attorney, Agent, or Firm* — Sterne, Kessler, Goldstein & Fox P.L.L.C.

(57) ABSTRACT

Methods and apparatus for measuring a parameter of interest of a target structure formed on substrate are disclosed. In one arrangement, the target structure comprises a first sub-target and a second sub-target. The first sub-target comprises a first bias and the second sub-target comprises a second bias. The method comprises determining the parameter of interest using a detected or estimated reference property of radiation at a first wavelength scattered from the first sub-target and a detected or estimated reference property of radiation at a second wavelength scattered from the second sub-target. The first wavelength is different to the second wavelength.

19 Claims, 5 Drawing Sheets

(56) References Cited

U.S. PATENT DOCUMENTS

| | | | |
|---|---|---|---|
| 2011/0137625 A1* | 6/2011 | Dirks | G03F 7/705 703/2 |
| 2015/0177166 A1* | 6/2015 | Cramer | G03F 7/70625 355/67 |
| 2016/0161864 A1 | 6/2016 | Middlebrooks et al. | |
| 2016/0223916 A1* | 8/2016 | Van Beurden | H01L 22/12 |
| 2016/0300767 A1 | 10/2016 | Ko et al. | |
| 2017/0023867 A1 | 1/2017 | Staals et al. | |
| 2017/0177760 A1* | 6/2017 | Socha | G03F 7/2004 |
| 2019/0107781 A1* | 4/2019 | Tinnemans | G01B 11/02 |

OTHER PUBLICATIONS

International Search Report and Written Opinion of the International Searching Authority directed to related International Patent Application No. PCT/EP2018/059304, dated Aug. 7, 2018; 10 pages.

* cited by examiner

Fig. 3
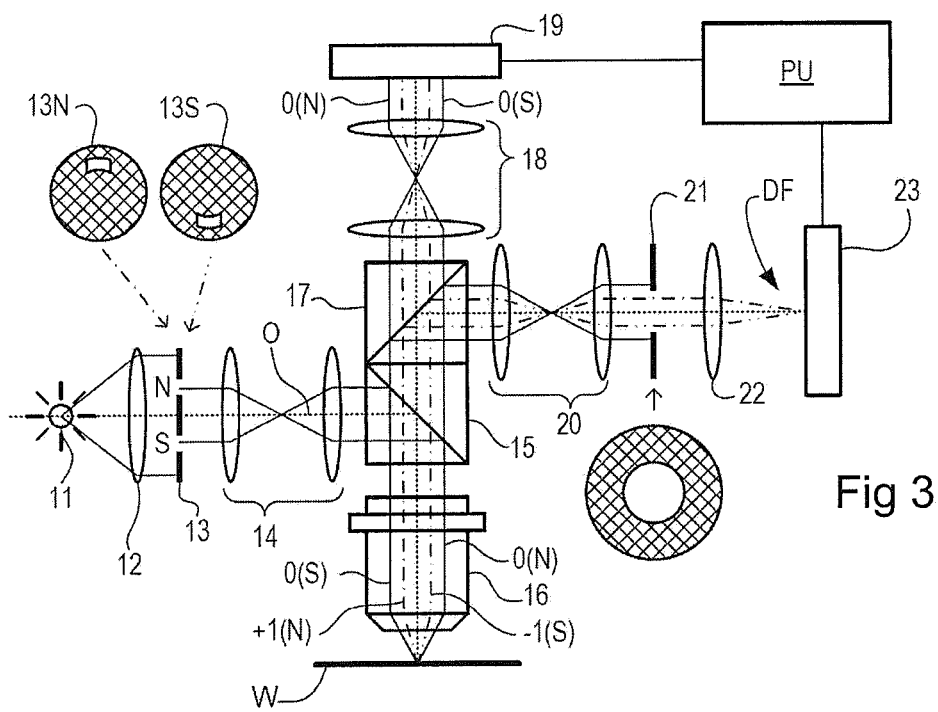
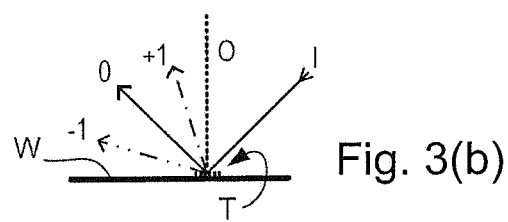
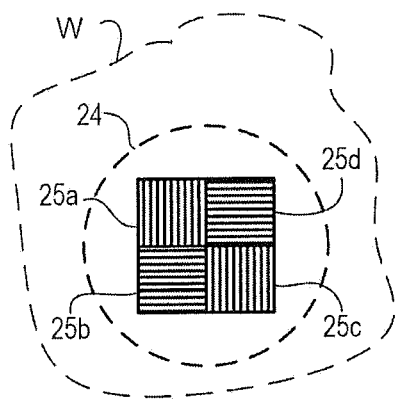
Fig. 3(c)
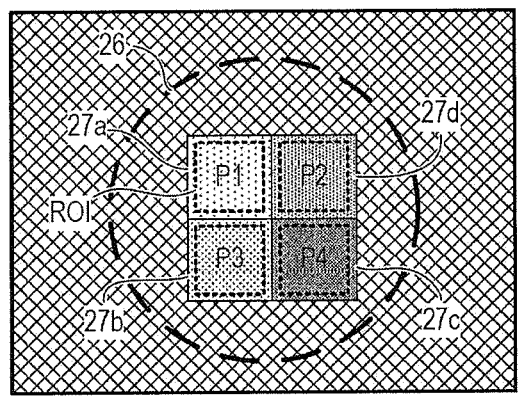
Fig. 3(d)

US 10,788,758 B2

METHOD OF MEASURING A PARAMETER OF INTEREST, DEVICE MANUFACTURING METHOD, METROLOGY APPARATUS, AND LITHOGRAPHIC SYSTEM

FIELD

The present invention relates to methods and apparatus for measuring a parameter of interest of a target structure formed on substrate, a device manufacturing method, and a lithographic system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection, or over a range of angles of reflection, as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches implemented using rigorous coupled wave analysis or finite element methods; library searches; and principal component analysis.

Targets may be measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety.

Intensity asymmetry between different diffraction orders (e.g. between $-1^{st}$ and the $+1^{st}$ diffraction orders) for a given overlay target provides a measurement of target asymmetry; that is, asymmetry in the target. This asymmetry in the overlay target can be used as an indicator of overlay (undesired misalignment of two layers).

Processing variations such as variations in the thickness of thin film stacks within target structures can affect the accuracy of measurements of parameters such as overlay.

SUMMARY

It is desirable to improve existing methods and apparatus for measuring a parameter of interest of a target structure.

According to an aspect of the invention, there is provided a method of measuring a parameter of interest of a target structure formed on a substrate, wherein: the target structure comprises a first sub-target and a second sub-target, wherein the first sub-target comprises a first bias and the second sub-target comprises a second bias, the first bias being different from the second bias; the method comprising: determining the parameter of interest using a detected or estimated reference property of radiation at a first wavelength scattered from the first sub-target and a detected or estimated reference property of radiation at a second wavelength scattered from the second sub-target, wherein the first wavelength is different from the second wavelength.

According to an aspect of the invention, there is provided a metrology apparatus for measuring a parameter of interest of a target structure formed on a substrate, wherein: the target structure comprises a first sub-target and a second sub-target, wherein the first sub-target comprises a first bias and the second sub-target comprises a second bias, the first bias being different from the second bias; and the apparatus comprises a processor configured to determine the parameter of interest using a detected or estimated reference property of radiation at a first wavelength scattered from the first sub-target and a detected or estimated reference property of radiation at a second wavelength scattered from the second sub-target, wherein the first wavelength is different to the second wavelength.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3(a)-3(d) comprise FIG. 3(a) a schematic diagram of a dark field scatterometer for use in measuring targets using a first pair of illumination apertures; FIG. 3(b) a detail of diffraction spectrum of a target grating for a given direction of illumination; FIG. 3(c) a depiction of a known form of multiple grating target and an outline of a measurement spot on a substrate; and FIG. 3(d) a depiction of an image of the target of FIG. 3(c) obtained in the scatterometer of FIG. 3(a)

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
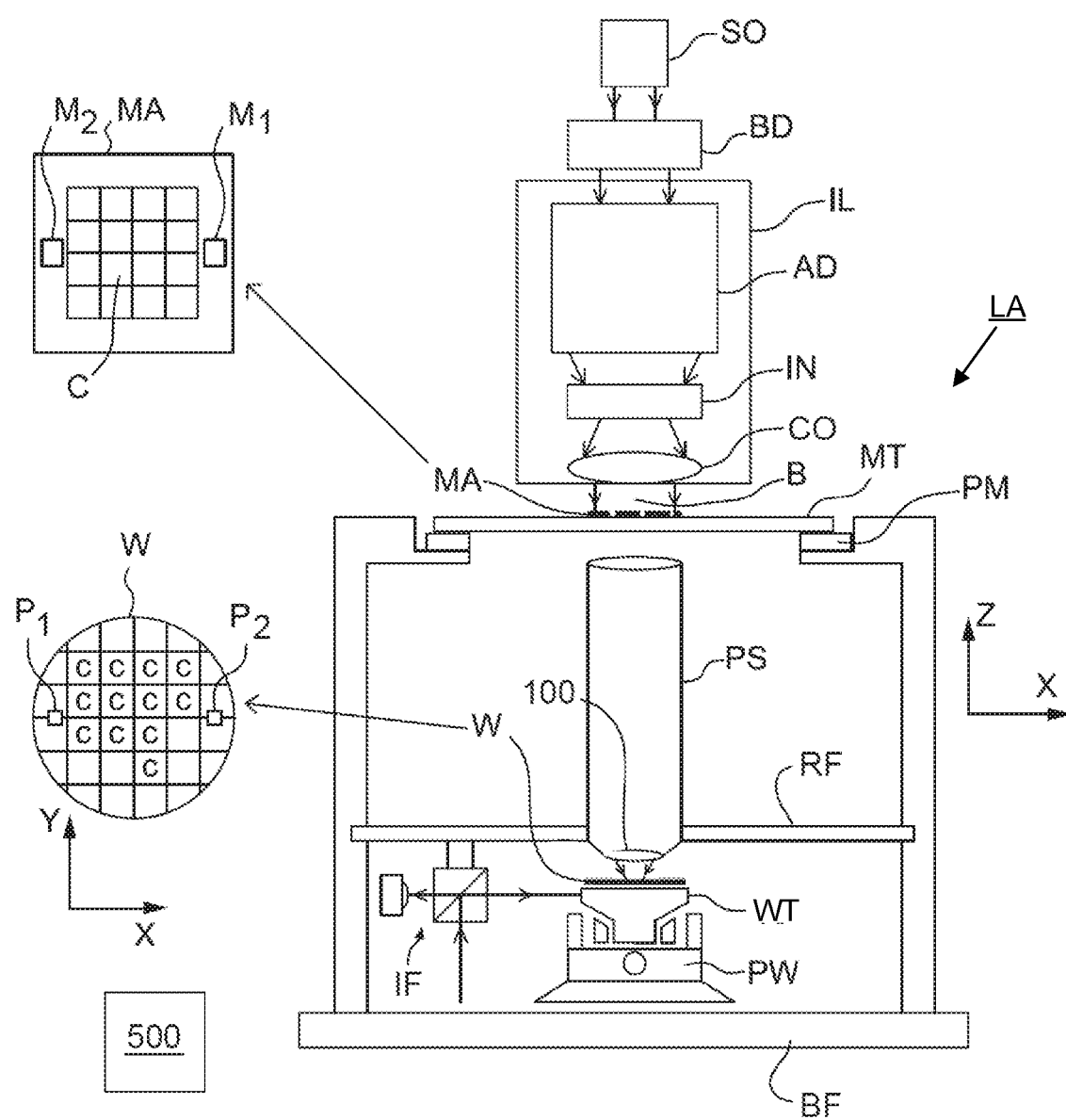
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
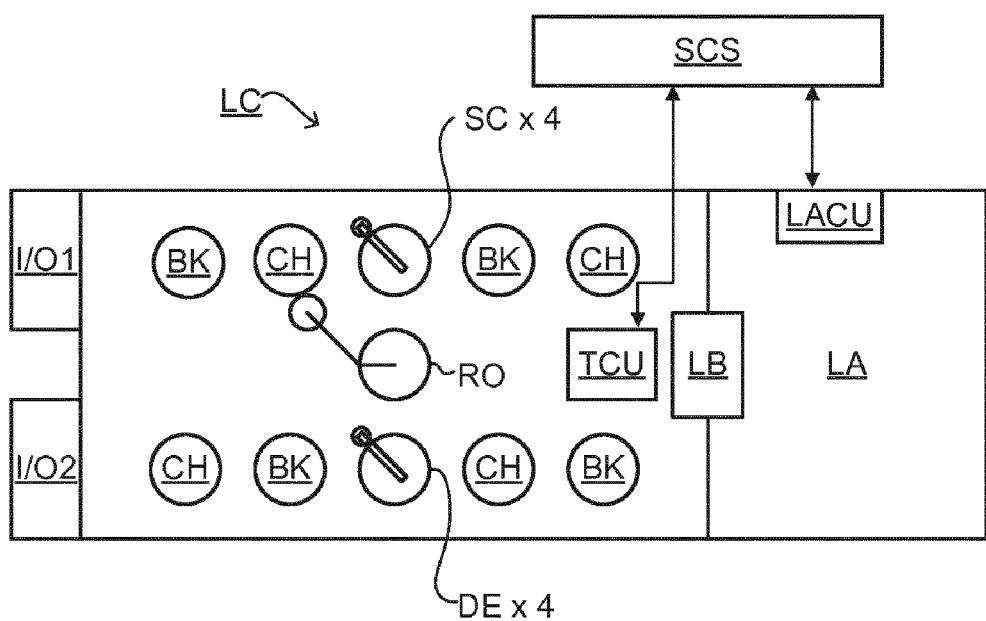
FIG. 2 depicts a lithographic cell or cluster.

As shown in FIG. 2 the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

A metrology apparatus is used to determine the properties of the substrates, and in particular, how the properties of different substrates or different layers of the same substrate vary from layer to layer. The metrology apparatus may be integrated into the lithographic apparatus LA or the lithocell LC or may be a stand-alone device. To enable most rapid measurements, it is desirable that the metrology apparatus measure properties in the exposed resist layer immediately after the exposure. However, the latent image in the resist has a very low contrast, as in there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

FIG. 3(c) depicts a (composite) target formed on a substrate according to known practice. The target in this example comprises four gratings 25a to 25d positioned closely together so that they will all be within a measurement scene or measurement spot 24 formed by the metrology radiation illumination beam of the metrology apparatus. The four gratings thus are all simultaneously illuminated and simultaneously imaged on sensors 19 and 23. In an example dedicated to measurement of overlay, gratings 25a to 25d are themselves composite gratings formed by overlying gratings that are patterned in different layers of the semi-conductor device formed on substrate W. Gratings 25a to 25d may have differently biased overlay offsets (deliberate mismatch between layers) in order to facilitate measurement of overlay between the layers in which the different parts of the composite gratings are formed. Such techniques are well known to the skilled person and will not be described further. Gratings 25a to 25d may also differ in their orientation, as shown, so as to diffract incoming radiation in X and Y directions. In one example, gratings 25a and 25c are X-direction gratings with biases of the +d, −d, respectively. Gratings 25b and 25d are Y-direction gratings with offsets +d and −d respectively. Separate images of these gratings can be identified in the image captured by sensor 23. This is only one example of a target. A target may comprise more or fewer than four gratings, or only a single grating.

FIG. 3(d) shows an example of an image that may be formed on and detected by the sensor 23, using the target of FIG. 3(c) in the apparatus of FIG. 3(a). While the pupil plane image sensor 19 cannot resolve the different individual gratings 25a to 25d, the image sensor 23 can do so. The dark rectangle represents the field of the image on the sensor, within which the illuminated spot 24 on the substrate is imaged into a corresponding circular area 26. Within this, rectangular areas 27a to 27d represent the images of the small target gratings 25a to 25d. If the targets are located in product areas, product features may also be visible in the periphery of this image field. Image processor and controller PU processes these images using pattern recognition to identify the separate images 27a to 27d of gratings 25a to 25d. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

A typical target structure for overlay measurement comprises two gratings formed in different layers at the same location on the substrate W. The two gratings are separated by one or more thin films (a thin film stack) that are deposited as part of the device structure being manufactured. For example, a typical DRAM manufacturing process uses a series of oxide and nitride thin films between bottom and top gratings, with the top grating being printed on an anti-reflection and hardmask thin film.

The thickness of the thin film stack in each target structure varies according to the position of the target structure due to processing variations. The thickness of the thin film stack has a direct impact on the reflectance properties of the thin film stack. Processing such as chemical mechanical planarization and etching may additionally cause asymmetry in the bottom grating. This is referred to as bottom grating asymmetry. The bottom grating asymmetry causes further variation in reflectance properties. The bottom grating asymmetry is particularly problematic because it contributes asymmetrically to detected intensities and therefore contributes to errors in measurements or modelling that rely on asymmetry, such as for obtaining overlay.

The strength of the intensity asymmetry from the property of interest (e.g. overlay), for example the intensity asymmetry between different diffraction orders, such as between the +1 and −1 diffraction orders, depends on properties of the measurement radiation used. The strength of the intensity asymmetry may vary for example as a function of the central wavelength, bandwidth and/or polarization of the measurement radiation. The strength of the intensity asymmetry may be referred to as sensitivity. A curve of predicted sensitivity against the property of interest may be generated. Such curves are known as swing curves. In an embodiment, a sensitivity K is defined as a coefficient describing the proportionality between a reference property of radiation scattered from the target structure A (e.g. an intensity asymmetry, for example between different diffraction orders, for example between the +1 and −1 diffraction orders) and the property of interest OV (e.g. overlay) as follows:

$$A = K \cdot OV$$

As described above with reference to FIG. 3(c), targets may be provided that have different known biases relative to each other. For example, gratings may be provided which are deliberately offset by equal and opposite amounts relative to each other. By measuring A for both of the differently biased targets two independent equations are obtained that relate A to OV. It is therefore possible to eliminate K and obtain OV if K is the same for both of the measurements. Process variations across the substrate W may, however, lead to a difference in the sensitivity K for the two differently biased targets, even if the two targets are positioned relatively closely to each other. Such process variations may comprise differences in the thickness of the thin film stack between the top and bottom gratings, differences in bottom grating asymmetry, or differences in the slope in the height of resist lines. A difference in the sensitivity K for the two differently biased targets will lead to an error in the parameter of interest OV obtained using the two targets.

Embodiments of the disclosure improve accuracy by using different wavelengths to measure the two different sub-targets (referred to below as a first sub-target and a second sub-target) and choosing the wavelengths so that any difference in sensitivity K is reduced.

In an embodiment, a method of measuring a parameter of interest OV of a target structure is provided. In an embodiment, the parameter of interest OV comprises overlay between structures formed in different layers of the target structure. An example of a target structure is shown in FIG. 3(c). The target structure comprises a first sub-target 25a and a second sub-target 25c. In the example of FIG. 3(c) the first sub-target 25a and the second sub-target 25c are X-direction gratings for measuring overlay. In other embodiments, the first sub-target is a Y-direction grating (such as grating 25b) and the second sub-target is a Y-direction grating (such as grating 25d). The first sub-target 25a comprises a first bias +d. The second sub-target 25c comprises a second bias −d. Each bias comprises a deliberate geometrical offset. In the particular example of FIG. 3(c), each bias comprises an overlay offset (i.e. an offset in the relative positions of the top and bottom gratings). The bias will normally be a shift of the same type as the parameter of interest. For example, in the case where the parameter of interest is overlay, which is a measure of alignment between two layers, the biases each comprise a deliberate misalignment (offset) between the two layers. The two biases +d and −d are different from each other. In an embodiment, the first bias +d and the second bias −d comprise equal and opposite biases.

The method comprises determining the parameter of interest OV using a detected or estimated reference property of radiation at a first wavelength (e.g. a narrow band of radiation centered at the first wavelength) scattered from the first sub-target 25a and a detected or estimated reference property of radiation at a second wavelength (e.g. a narrow band of radiation centered at the second wavelength) scattered from the second sub-target 25c. The radiation at the first wavelength and the radiation at the second wavelength may be scattered from the first sub-target 25a and the second sub-target 25c at the same time or at different times. The reference property of radiation may comprise an intensity asymmetry, for example between different diffraction orders, for example between the +1 and −1 diffraction orders). In an embodiment, the method is performed by a metrology apparatus. The metrology apparatus may be configured, for example, as described above with reference to FIG. 3. In this case, the determination of the parameter of interest OV may be performed by the processor PU.

The first wavelength is different to the second wavelength. A sensitivity K of the reference property of radiation scattered from each of the first sub-target 25a and the second sub-target 25c to change in the parameter of interest OV varies as a function of the wavelength of the radiation. Measuring the first sub-target 25a at a different wavelength to the second sub-target 25c makes it possible to at least partially correct for a difference in the sensitivity K of the first sub-target 25a relative to the sensitivity of the second sub-target 25c caused by process variations.

For example, in a case where process variations cause the thickness of the first sub-target 25a to be $t_0$ and the thickness of the second sub-target 25c to be $t_0+\Delta t$, in a first order perturbation theory approximation, the sensitivity K of the second sub-target at wavelength $\lambda_0$ can be expressed as follows:

$$K(\lambda_0, t_0 + \Delta t) = \frac{\partial K}{\partial t}\Delta t + K(\lambda_0, t_0)$$

The sensitivity K of the first sub-target 25a at the wavelength $\lambda_0+\Delta\lambda$ can be expressed as $$K(\lambda_0 + \Delta\lambda, t_0) = \frac{\partial K}{\partial \lambda}\Delta\lambda + K(\lambda_0, t_0)$$

Therefore it is possible to obtain $K(\lambda_0+\Delta\lambda, t_0)=K(\lambda_0, t_0+\Delta t)$ as long as the following relation is satisfied:

$$\frac{\partial K}{\partial t}\Delta t = \frac{\partial K}{\partial \lambda}\Delta\lambda$$

Thus, variations in K due to changes in stack thickness are equivalent, to first order, to variations in K due to changes in wavelength.

Based on this principle, in an embodiment the first wavelength and the second wavelength are selected such that the sensitivity K of the reference property of radiation scattered from the first sub-target 25a to change in the parameter of interest OV is substantially equal to the sensitivity K of the reference property of radiation scattered from the second sub-target 25c to change in the parameter of interest OV. In the particular example considered above, an improved value for overlay in the presence of stack thickness variations is obtained by measuring the first sub-target 25a at wavelength $\lambda_0$ (i.e. arranging for the first wavelength to be $\lambda_0$), and measuring the second sub-target at wavelength $\lambda_0+\Delta\lambda$ (i.e. arranging for the second wavelength to be $\lambda_0+\Delta\lambda$).

The $\Delta\lambda$ that achieves substantial matching of the sensitivities K of the first sub-target 25a and the second sub-target 25c can be obtained without needing detailed knowledge of structural differences between the sub-targets (e.g. thickness differences) because sensitivities K at local maxima and local minima in the swing curve are not significantly changed by small shifts in the wavelength, to first order. Thus, equal sensitivities K for the first sub-target 25a and the second sub-target 25c can be achieved by measuring each at a wavelength corresponding to a local maximum or local minimum.

Figure 4:
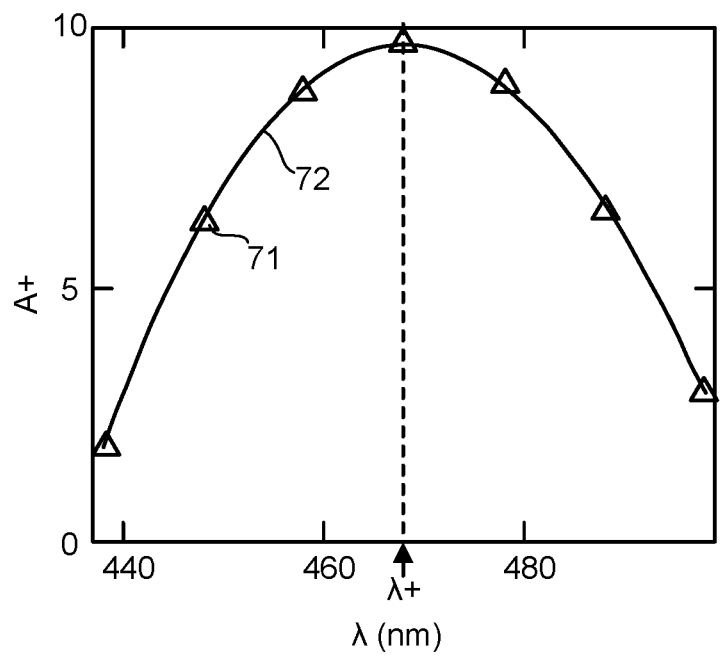
FIG. 4 is a graph depicting calculated intensity asymmetries between +1 and −1 diffraction orders for simulated scattering from a first sub-target at multiple wavelengths, and a curve fitted to the calculated values.
Figure 5:
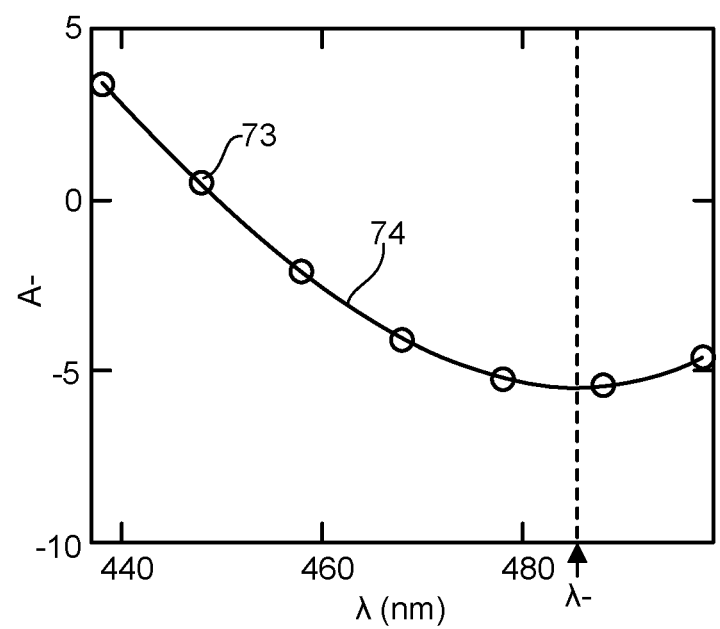
FIG. 5 is a graph depicting calculated intensity asymmetries between +1 and −1 diffraction orders for simulated scattering from a second sub-target at multiple wavelengths, and a curve fitted to the calculated values.

FIGS. 4 and 5 depict the results of simulations of scattering from a pair of sub-targets having different biases. Measurements of a reference property of radiation scattered from the sub-targets (an intensity asymmetry between +1 and −1 diffraction orders in this example) were simulated for seven different wavelengths. The different wavelengths were spaced apart from each other by 10 nm.

In the results shown in FIG. 4, a detection of the reference property A+ from a first sub-target was simulated at each of the seven wavelengths (which are an example of a first plurality of wavelengths) to obtain a corresponding plurality of first sub-target measurements. The seven first sub-target measurements are indicated by triangles 71. Each first sub-target measurement corresponds to measurement at a different wavelength.

In the results shown in FIG. 5, a detection of the reference property A— from a second sub-target was simulated at each of the seven wavelengths (which are an example of a second plurality of wavelengths) to obtain a corresponding plurality of second sub-target measurements. The seven second sub-target measurements are indicated by triangles 73. Each second sub-target measurement corresponds to measurement at a different wavelength.

In an embodiment, the first wavelength is selected using the first sub-target measurements and the second wavelength is selected using the second sub-target measurements (e.g. using processor PU). Example approaches are described below.

In an embodiment, the selection is performed such that the first wavelength is a first turning point wavelength $\lambda_+$. The first turning point wavelength $\lambda_+$ is the wavelength at which a derivative of the reference property of the scattered radiation from the first sub-target 25a with respect to wavelength is zero (i.e. a minimum or a maximum). In an embodiment, the reference property of radiation at the first wavelength scattered from the first sub-target 25a is estimated using the plurality of first sub-target measurements to mathematically predict a variation of the reference property with wavelength and using the predicted variation to determine a value of the reference property at the first turning point wavelength $\lambda_+$. For the simulation of FIG. 4, for example, a mathematical curve fitting algorithm may be used to fit a curve 72 to the first sub-target measurements, as shown. In the particular example shown, a third order polynomial fitting is used. The fitted curve 72 can be used to find the value of the reference property at the turning point of the curve using standard techniques.

In an embodiment, the selection is performed such that the second wavelength is a second turning point wavelength $\lambda_-$. The second turning point wavelength $\lambda_-$ is the wavelength at which a derivative of the reference property of the scattered radiation from the second sub-target 25c with respect to wavelength is zero (i.e. a minimum or a maximum). In an embodiment, the reference property of radiation at the second wavelength scattered from the second sub-target 25c is estimated using the plurality of second sub-target measurements to mathematically predict a variation of the reference property with wavelength and using the predicted variation to determine a value of the reference property at the second turning point wavelength $\lambda_-$. For the simulation of FIG. 5, for example, a mathematical curve fitting algorithm may be used to fit a curve 74 to the second sub-target measurements, as shown. In the particular example shown, a third order polynomial fitting is used. The fitted curve 74 can be used to find the value of the reference property at the turning point of the curve using standard techniques.

Figure 6:
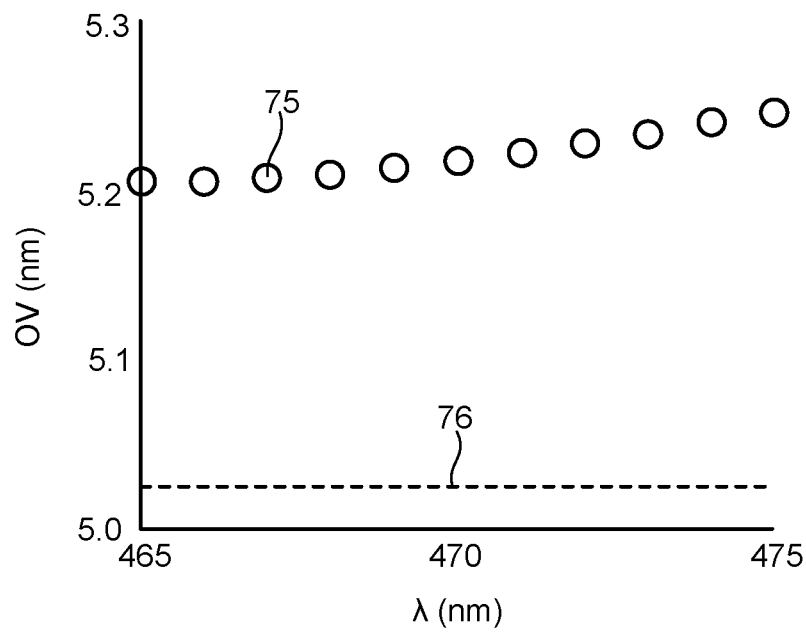
FIG. 6 is a graph depicting simulated overlay measurements for 20 different stacks compared with an overlay value obtained using an embodiment of the disclosure.
Figure 7:
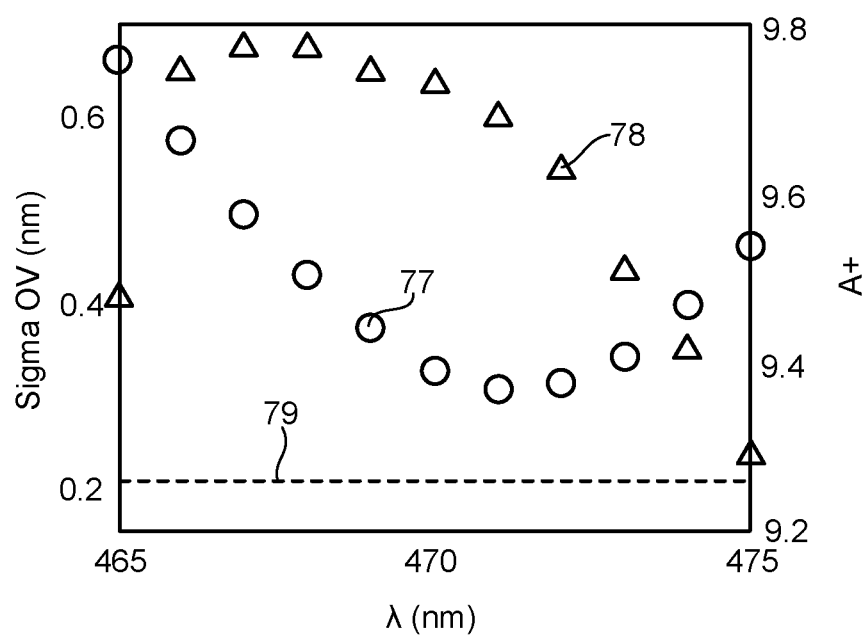
FIG. 7 is a graph depicting calculated intensity asymmetries between +1 and −1 diffraction orders for simulated scattering from a first sub-target at multiple wavelengths.

FIGS. 6 and 7 depict the results of simulations of measurements on a set of sub-targets having 20 different oxide layer thicknesses between the top and bottom gratings. All of the sub-targets had 5 nm overlay. The oxide layer was made to vary according to a Gaussian distribution with a mean of 400 nm and a standard deviation of 5 nm.

In FIG. 6, the circles 75 represent simulated values of overlay obtained by applying radiation of the same wavelength to the set of sub-targets for multiple different wavelengths. The actual overlay in these simulations was 5 nm, so all of the circles 75 indicate erroneously high values for overlay. Of the wavelengths depicted it appears that the highest accuracy is achieved in the region of 465 nm. The broken line 76 depicts the overlay obtained using a method of the present disclosure. Although the obtained overlay is slightly higher than 5 nm (about 5.02 nm), the error is significantly lower than the best achieved by the circles 75.

In FIG. 7, the circles 77 represent standard deviations in the overlay values represented by the circles 75 in FIG. 6. The triangles 78 represent the size of a calculated intensity asymmetry A+ used to obtain the overlay values represented by the circles 75 in FIG. 6. The broken line 79 depicts the standard deviation in the overlay value represented by the broken line 76 in FIG. 6. The circles 77 show that the standard deviation in the overlay values varies significantly as a function of wavelength, reaching a minimum (of about 0.3 nm at about 471 nm) that is significantly higher than the standard deviation achieved by the method of the present disclosure (about 0.2 nm). Furthermore, triangles 78 show that the size of the signal being measured varies significantly over the wavelength range and that the wavelength at which the minimum standard deviation is achieved is not the same as the wavelength at which the signal is maximal. These simulations demonstrate that methods of the disclosure yield values of overlay that are both nearer to the true overlay and have a smaller standard deviation.

Simulations also show that individual measurements of overlay at different oxide layer thicknesses are more accurate using embodiments of the disclosure than using standard techniques in which differently biased sub-targets are illuminated at the same wavelength. For example, for an oxide layer thickness of 5 nm, it was found that an embodiment of the disclosure indicated that overlay was 5.19 nm while a standard technique indicated that overlay was 5.35 nm. For an oxide layer thickness of 10 nm, the embodiment of the disclosure indicated that overlay was 5.34 nm while the standard technique indicated that overlay was 6.01 nm. For an oxide layer thickness of 20 nm, the embodiment of the disclosure indicated that overlay was 5.64 nm while the standard technique indicated that overlay was 8.28 nm. In each case, overlay was found to be much closer to the true value of 5 nm when using the embodiment of the disclosure than when using the standard technique.

In an alternative embodiment, the reference property of radiation at the first wavelength scattered from the first sub-target 25*a* is detected by illuminating the first sub-target 25*a* with radiation at the first wavelength and detecting the reference property of radiation at the first wavelength scattered from the first sub-target 25*a*. Thus, the first sub-target measurements are used to select the first wavelength and a subsequent measurement is then made on the first sub-target 25*a* using radiation at the selected first wavelength. Similarly, the reference property of radiation at the second wavelength scattered from the second sub-target 25*c* is detected by illuminating the second sub-target 25*c* with radiation at the second wavelength and detecting the reference property of radiation at the second wavelength scattered from the second sub-target 25*c*. Thus, the second sub-target measurements are used to select the second wavelength and a subsequent measurement is made on the second sub-target 25*c* using radiation at the selected second wavelength. This approach requires additional measurements to be carried out but may potentially achieve greater accuracy than approaches which rely solely on the initial first sub-target measurements, initial second sub-target measurements, and curve fitting.

The methods described above may be provided as part of a device manufacturing method. The device manufacturing method may comprise forming structures on a substrate W using a manufacturing sequence including at least one lithography step. The structures thus formed comprise the target structures to which the method of measuring a parameter of interest is applied. The target structures are thus defined or formed by a lithographic process.

The methods described above may be implemented using a metrology apparatus configured to measure a parameter of interest of a target structure formed on a substrate. The metrology apparatus may be configured as described above with reference to FIG. 3 for example, with the processor PU being configured to perform any of the computational steps of the method.

The concepts disclosed herein may find utility beyond post-lithography measurement of structures for monitoring purposes. For example, such a detector architecture may be used in future alignment sensor concepts that are based on pupil plane detection, used in lithographic apparatuses for aligning the substrate during the patterning process.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, the invention can be implemented by the provision of updated computer program products for causing a processor to perform the methods described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Further embodiments according to the invention are described in below numbered clauses:

1. A method of measuring a parameter of interest of a target structure formed on a substrate, wherein:
the target structure comprises a first sub-target and a second sub-target, wherein the first sub-target comprises a first bias and the second sub-target comprises a second bias, the first bias being different from the second bias;
the method comprising:
determining the parameter of interest using a detected or estimated reference property of radiation at a first wavelength scattered from the first sub-target and a detected or estimated reference property of radiation at a second wavelength scattered from the second sub-target, wherein the first wavelength is different from the second wavelength.

2. The method of clause 1, wherein the parameter of interest comprises overlay between structures formed in different layers of the target structure.

3. The method of any preceding clause, wherein the reference property comprises an intensity asymmetry between different diffraction orders of the scattered radiation.

4. The method of any preceding clause, wherein the first bias and the second bias each comprise a deliberate geometrical offset.

5. The method of any preceding clause, wherein the first bias and the second bias comprise equal and opposite biases.

6. The method of any preceding clause, wherein:
a sensitivity of the reference property of radiation scattered from each of the first sub-target and the second sub-target to change in the parameter of interest varies as a function of the wavelength of the radiation; and
the first wavelength and the second wavelength are selected such that the sensitivity of the reference property of radiation scattered from the first sub-target to change in the parameter of interest is substantially equal to the sensitivity of the reference property of radiation scattered from the second sub-target to change in the parameter of interest.

7. The method of any preceding clause, comprising:
detecting the reference property of scattered radiation from the first sub-target at each of a first plurality of wavelengths to obtain a corresponding plurality of first sub-target measurements;
detecting the reference property of scattered radiation from the second sub-target at each of a second plurality of wavelengths to obtain a corresponding plurality of second sub-target measurements;
using the plurality of first sub-target measurements to select the first wavelength; and
using the plurality of second sub-target measurements to select the second wavelength.

8. The method of clause 7, wherein:
the first wavelength is selected such that a derivative of the reference property of the scattered radiation from the first sub-target with respect to wavelength is zero at the first wavelength; and
the second wavelength is selected such that a derivative of the reference property of the scattered radiation from the second sub-target with respect to wavelength is zero at the second wavelength.

9. The method of clause 8, wherein:
the reference property of radiation at the first wavelength scattered from the first sub-target is estimated using the plurality of first sub-target measurements to mathematically predict a variation of the reference property with wavelength and using the predicted variation to determine a value of the reference property at the first wavelength; and
the reference property of radiation at the second wavelength scattered from the second sub-target is estimated using the plurality of second sub-target measurements to mathematically predict a variation of the reference property with wavelength and using the predicted variation to determine a value of the reference property at the second wavelength.

10. The method of clause 7 or 8, wherein:
the reference property of radiation at the first wavelength scattered from the first sub-target is detected by illuminating the first sub-target with radiation at the first wavelength and detecting the reference property of radiation at the first wavelength scattered from the first sub-target; and
the reference property of radiation at the second wavelength scattered from the second sub-target is detected by illuminating the second sub-target with radiation at the second wavelength and detecting the reference property of radiation at the second wavelength scattered from the second sub-target.

11. The method of any preceding clause, wherein the target structure is defined or formed by a lithographic process.

12. A device manufacturing method, comprising:
forming structures on a substrate using a manufacturing sequence including at least one lithography step, the structures comprising a target structure;
measuring a parameter of interest of the target structure using the method of any preceding clause.

13. A metrology apparatus for measuring a parameter of interest of a target structure formed on a substrate, wherein:
the target structure comprises a first sub-target and a second sub-target, wherein the first sub-target comprises a first bias and the second sub-target comprises a second bias, the first bias being different from the second bias; and
the apparatus comprises a processor configured to determine the parameter of interest using a detected or estimated reference property of radiation at a first wavelength scattered from the first sub-target and a detected or estimated reference property of radiation at a second wavelength scattered from the second sub-target, wherein the first wavelength is different to the second wavelength.

14. The apparatus of clause 13, wherein the parameter of interest comprises overlay between structures formed in different layers of the target structure.

15. The apparatus of clause 13 or 14, wherein the reference property comprises an intensity asymmetry between different diffraction orders of the scattered radiation at a detector.

16. The apparatus of any of clauses 13-15, wherein the first bias and the second bias each comprise a deliberate geometrical offset.

17. The apparatus of any of clauses 13-16, wherein the first bias and the second bias comprise equal and opposite biases.

18. The apparatus of any of clauses 13-17, wherein:
a sensitivity of the reference property of radiation scattered from each of the first sub-target and the second sub-target to change in the parameter of interest varies as a function of the wavelength of the radiation; and
the processor is configured to select the first wavelength and the second wavelength such that the sensitivity of the reference property of radiation scattered from the first sub-target to change in the parameter of interest is substantially equal to the sensitivity of the reference property of radiation scattered from the second sub-target to change in the parameter of interest.

19. The apparatus of any of clauses 13-18, comprising a measurement system configured to:
detect the reference property of scattered radiation from the first sub-target at each of a first plurality of wavelengths to obtain a corresponding plurality of first sub-target measurements; and
detect the reference property of scattered radiation from the second sub-target at each of a second plurality of wavelengths to obtain a corresponding plurality of second sub-target measurements, wherein:
the processor is configured to:
use the plurality of first sub-target measurements to select the first wavelength; and
use the plurality of second sub-target measurements to select the second wavelength.

20. The apparatus of clause 19, wherein:
the first wavelength band is selected such that a derivative of the reference property of the scattered radiation from the first sub-target with respect to wavelength is zero at the first wavelength; and
the second wavelength is selected such that a derivative of the reference property of the scattered radiation from the second sub-target with respect to wavelength is zero at the second wavelength.

21. The apparatus of clause 20, wherein the processor is configured such that:
the reference property of radiation at the first wavelength scattered from the first sub-target is estimated using the plurality of first sub-target measurements to mathematically predict a variation of the reference property with wavelength and using the predicted variation to determine a value of the reference property at the first wavelength; and
the reference property of radiation at the second wavelength scattered from the second sub-target is estimated using the plurality of second sub-target measurements to mathematically predict a variation of the reference property with wavelength and using the predicted variation to determine a value of the reference property at the second wavelength.

22. The apparatus of clause 19 or 20, wherein the measurement system is configured to:
detect the reference property of radiation at the first wavelength scattered from the first sub-target by illuminating the first sub-target with radiation at the first wavelength and detecting the reference property of radiation at the first wavelength scattered from the first sub-target; and
detect the reference property of radiation at the second wavelength scattered from the second sub-target by illuminating the second sub-target with radiation at the second wavelength and detecting the reference property of radiation at the second wavelength scattered from the second sub-target.

23. The apparatus of any of clauses 13-22, wherein the target structure is defined or formed by a lithographic process.

24. A lithographic system comprising:
a lithographic apparatus configured to define structures to be formed on a substrate using a manufacturing sequence including at least one lithography step, the structures comprising a target structure; and
the metrology apparatus of any of clauses 13-23.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:
1. A method comprising:
a first detecting or estimating of a reference property of radiation (A+) at a first wavelength scattered from a first sub-target of a target structure, the first wavelength being the wavelength at which a derivative of the reference property of the scattered radiation from the first sub-target with respect to wavelength is zero, the first sub-target comprising a first bias;

a second detecting or estimating of the reference property of radiation at a second wavelength (A−) scattered from a second sub-target of the target structure, the second wavelength being the wavelength at which a derivative of the reference property of the scattered radiation from the second sub-target with respect to wavelength is zero, the second sub-target comprising a second bias different than the first bias, and the first wavelength being different from the second wavelength; and determining a parameter of interest based on the first and second detecting or estimating.

2. The method of claim 1, wherein the parameter of interest comprises overlay between structures formed in different layers of the target structure.

3. The method of claim 1, wherein the reference property comprises an intensity asymmetry between different diffraction orders of the scattered radiation.

4. The method of claim 1, wherein the first bias and the second bias each comprise a deliberate geometrical offset.

5. The method of claim 1, wherein the first bias and the second bias comprise equal and opposite biases.

6. The method of claim 1, wherein:
a sensitivity of the reference property of radiation scattered from each of the first sub-target and the second sub-target to change in the parameter of interest varies as a function of the wavelength of the radiation; and
the first wavelength and the second wavelength are selected such that the sensitivity of the reference property of radiation scattered from the first sub-target to change in the parameter of interest is substantially equal to the sensitivity of the reference property of radiation scattered from the second sub-target to change in the parameter of interest.

7. The method of claim 1, comprising:
detecting the reference property of scattered radiation from the first sub-target at each of a first plurality of wavelengths to obtain a corresponding plurality of first sub-target measurements;
detecting the reference property of scattered radiation from the second sub-target at each of a second plurality of wavelengths to obtain a corresponding plurality of second sub-target measurements;
using the plurality of first sub-target measurements to select the first wavelength; and
using the plurality of second sub-target measurements to select the second wavelength.

8. The method of claim 7, wherein:
the reference property of radiation at the first wavelength scattered from the first sub-target is detected by illuminating the first sub-target with radiation at the first wavelength and detecting the reference property of radiation at the first wavelength scattered from the first sub-target; and
the reference property of radiation at the second wavelength scattered from the second sub-target is detected by illuminating the second sub-target with radiation at the second wavelength and detecting the reference property of radiation at the second wavelength scattered from the second sub-target.

9. The method of claim 1, wherein:
the reference property of radiation at the first wavelength scattered from the first sub-target is estimated using the plurality of first sub-target measurements to mathematically predict a variation of the reference property with wavelength and using the predicted variation to determine a value of the reference property at the first wavelength; and the reference property of radiation at the second wavelength scattered from the second sub-target is estimated using the plurality of second sub-target measurements to mathematically predict a variation of the reference property with wavelength and using the predicted variation to determine a value of the reference property at the second wavelength.

10. The method of claim 1, wherein the target structure is defined or formed by a lithographic process.

11. A device manufacturing method, comprising:
forming structures on a substrate using a manufacturing sequence including at least one lithography step, the structures comprising a target structure;
measuring a parameter of interest of the target structure, the measuring comprising:
a first detecting or estimating of a reference property of radiation at a first wavelength scattered from a first sub-target of the target structure, the first wavelength being the wavelength at which a derivative of the reference property of the scattered radiation from the first sub-target with respect to wavelength is zero, the first sub-target comprising a first bias;
a second detecting or estimating of the reference property of radiation at a second wavelength scattered from a second sub-target of the target structure, the second wavelength being the wavelength at which a derivative of the reference property of the scattered radiation from the second sub-target with respect to wavelength is zero, the second sub-target comprising a second bias different than the first bias, and the first wavelength being different from the second wavelength; and
determining a parameter of interest based on the first and second detecting or estimating.

12. A metrology apparatus for measuring a parameter of interest of a target structure formed on a substrate, the apparatus comprising:
a processor configured to:
perform a first detecting or estimating of a reference property of radiation at a first wavelength scattered from a first sub-target of the target structure, the first wavelength being the wavelength at which a derivative of the reference property of the scattered radiation from the first sub-target with respect to wavelength is zero, the first sub-target comprising a first bias;
perform a second detecting or estimating of the reference property of radiation at a second wavelength scattered from a second sub-target of the target structure, the second wavelength being the wavelength at which a derivative of the reference property of the scattered radiation from the second sub-target with respect to wavelength is zero, the second sub-target comprising a second bias different than the first bias, and the first wavelength being different from the second wavelength; and
determine a parameter of interest based on the first and second detecting or estimating.

13. The apparatus of claim 12, wherein the parameter of interest comprises overlay between structures formed in different layers of the target structure.

14. The apparatus of claim 12, wherein the reference property comprises an intensity asymmetry between different diffraction orders of the scattered radiation at a detector.

15. The apparatus of claim 12, wherein the first bias and the second bias each comprise a deliberate geometrical offset.

16. The apparatus of claim 12, wherein the first bias and the second bias comprise equal and opposite biases.

17. The apparatus of claim 12, wherein:
- a sensitivity of the reference property of radiation scattered from each of the first sub-target and the second sub-target to change in the parameter of interest varies as a function of the wavelength of the radiation; and
- the processor is configured to select the first wavelength and the second wavelength such that the sensitivity of the reference property of radiation scattered from the first sub-target to change in the parameter of interest is substantially equal to the sensitivity of the reference property of radiation scattered from the second sub-target to change in the parameter of interest.

18. The apparatus of claim 12, further comprising a measurement system configured to:
- detect the reference property of scattered radiation from the first sub-target at each of a first plurality of wavelengths to obtain a corresponding plurality of first sub-target measurements; and
- detect the reference property of scattered radiation from the second sub-target at each of a second plurality of wavelengths to obtain a corresponding plurality of second sub-target measurements, wherein the processor is configured to:
- use the plurality of first sub-target measurements to select the first wavelength; and
- use the plurality of second sub-target measurements to select the second wavelength.

19. A lithographic system comprising:
- a lithographic apparatus configured to define structures to be formed on a substrate using a manufacturing sequence including at least one lithography step, the structures comprising a target structure; and
- a metrology apparatus for measuring a parameter of interest of a target structure formed on a substrate, the metrology apparatus comprising a processor configured to:
  - perform a first detecting or estimating of a reference property of radiation at a first wavelength scattered from a first sub-target of the target structure, the first wavelength being the wavelength at which a derivative of the reference property of the scattered radiation from the first sub-target with respect to wavelength is zero, the first sub-target comprising a first bias;
  - perform a second detecting or estimating of the reference property of radiation at a second wavelength scattered from a second sub-target of the target structure, the second wavelength being the wavelength at which a derivative of the reference property of the scattered radiation from the second sub-target with respect to wavelength is zero, the second sub-target comprising a second bias different than the first bias, and the first wavelength being different from the second wavelength; and
  - determine a parameter of interest based on the first and second detecting or estimating.

* * * * *